United States Patent
Andreev et al.

(10) Patent No.: US 10,580,611 B2
(45) Date of Patent: Mar. 3, 2020

(54) RAPID 3D PROTOTYPING AND FABRICATING OF SLOW-WAVE STRUCTURES, INCLUDING ELECTROMAGNETIC META-MATERIAL STRUCTURES, FOR MILLIMETER-WAVELENGTH AND TERAHERTZ-FREQUENCY HIGH-POWER VACUUM ELECTRONIC DEVICES

(71) Applicant: Raytheon Company, Waltham, MA (US)

(72) Inventors: Andrey D. Andreev, Albuquerque, NM (US); J. Gregory Moxness, Tucson, AZ (US); Maysa-Maria K. Peterson Lach, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 544 days.

(21) Appl. No.: 14/603,987

(22) Filed: Jan. 23, 2015

(65) Prior Publication Data

US 2016/0056005 A1  Feb. 25, 2016

Related U.S. Application Data

(60) Provisional application No. 62/040,231, filed on Aug. 21, 2014.

(51) Int. Cl.
*B22F 3/105* (2006.01)
*B29C 64/141* (2017.01)
(Continued)

(52) U.S. Cl.
CPC ............ *H01J 23/24* (2013.01); *B22F 3/1055* (2013.01); *B22F 5/106* (2013.01); *B29C 64/141* (2017.08);
(Continued)

(58) Field of Classification Search
CPC ...... B22F 5/10; B22F 5/106; B22F 2005/004; B22F 2005/005; B29L 2031/34;
(Continued)

(56) References Cited

U.S. PATENT DOCUMENTS 2,446,825 A * 8/1948 Gurewitsch ............. B30B 15/24
313/157
2,458,802 A   1/1949 Spencer
(Continued)

FOREIGN PATENT DOCUMENTS

CN   102520480 A   6/2012
CN   102520480 A1  6/2012

OTHER PUBLICATIONS

PCT International Preliminary Report dated Mar. 2, 2017 for International Application No. PCT/US2015/029629; 8 Pages.
(Continued)

*Primary Examiner* — Vanessa T. Luk
(74) *Attorney, Agent, or Firm* — Daly, Crowley, Mofford & Durkee, LLP (57) ABSTRACT

A method for fabricating slow-wave structures, including electromagnetic meta-material structures, for high-power slow-wave vacuum electronic devices operating in millimeter-wavelength (30 GHz-300 GHz) and terahertz-frequency (300 GHz and beyond) bands of electromagnetic spectrum. The method includes: loading a digital three dimensional model of a slow-wave structure in a memory of a 3D printer, the loaded digital three dimensional model having data therein representative of the slow-wave structure to be fabricated by the 3D printer; loading metal powder material into the 3D printer; and operating the 3D printer to melt the metal powder material in accordance with the loaded three dimensional model of the slow-wave structure and then to
(Continued)

solidify the melted layer of the metal powder material to fabricate the slow-wave structure layer by layer.

3 Claims, 11 Drawing Sheets (51) Int. Cl.

| | |
|---|---|
| H01J 23/24 | (2006.01) |
| H03F 3/58 | (2006.01) |
| H01Q 15/00 | (2006.01) |
| B22F 5/10 | (2006.01) |
| B22F 5/00 | (2006.01) |
| B33Y 10/00 | (2015.01) |
| B33Y 50/00 | (2015.01) |
| B33Y 70/00 | (2020.01) |
| B33Y 80/00 | (2015.01) |
| B29L 31/34 | (2006.01) |

(52) U.S. Cl.
CPC .......... *H01Q 15/0086* (2013.01); *H03F 3/58* (2013.01); *B22F 2003/1057* (2013.01); *B22F 2005/005* (2013.01); *B29L 2031/34* (2013.01); *B33Y 10/00* (2014.12); *B33Y 50/00* (2014.12); *B33Y 70/00* (2014.12); *B33Y 80/00* (2014.12); *Y02P 10/295* (2015.11)

(58) Field of Classification Search
CPC ......... B29L 2031/3406; H01Q 15/0086; H03F 3/58; H01J 23/24; H01J 23/26; H01J 23/27; H01J 23/28; H01J 23/30; H01J 23/34; H01J 25/34; H01J 25/36; H01J 25/38; H01J 25/40; H01J 25/42; H01J 25/44; H01J 25/46; H01J 25/48; H01J 25/49; H01J 25/55; H01J 25/56; H01J 25/61; H01J 25/62; H01J 25/64; H01J 25/66; H01P 1/18; H01P 1/181; H01P 1/182; H01P 1/183; H01P 1/184; H01P 1/19; H01P 1/195
USPC ..... 315/3.5, 39.3, 3.6, 4, 5, 5.11, 5.12, 5.13, 315/5.14, 5.15, 5.16, 5.17, 5.18, 5.19, 315/5.21, 5.22, 5.23, 5.24, 5.25, 5.26, 315/5.27, 5.28, 5.29, 5.31, 5.32, 5.33, 315/5.34, 5.35, 5.36, 5.37, 5.38, 5.39, 315/5.41, 5.42, 5.43, 5.44, 5.45, 5.46, 315/5.47, 5.48, 5.49, 5.51, 5.52, 5.53, 315/5.54, 7; 333/138–164
See application file for complete search history.

(56) References Cited

U.S. PATENT DOCUMENTS

| | | | | |
|---|---|---|---|---|
| 3,260,885 | A | * | 7/1966 | Crapuchettes .......... H01J 19/74 313/12 |
| 3,792,306 | A | * | 2/1974 | Smith ...................... H01J 23/22 315/39.57 |
| 5,196,765 | A | | 3/1993 | MacMaster et al. |
| 5,487,821 | A | * | 1/1996 | Sieck ........................ C23C 14/35 204/192.12 |
| 6,525,477 | B2 | * | 2/2003 | Small ...................... H01J 23/213 315/39.51 |
| 7,729,506 | B2 | * | 6/2010 | Carlson .............. G05B 19/4097 382/100 |
| 8,125,717 | B2 | * | 2/2012 | Sanada .................. H01Q 15/02 359/315 |
| 8,508,132 | B1 | | 8/2013 | Andreev et al. |
| 2005/0133527 | A1 | | 6/2005 | Dullea et al. |
| 2010/0118412 | A1 | | 5/2010 | Sanada |
| 2012/0225767 | A1 | | 9/2012 | Imholt et al. |
| 2013/0015596 | A1 | * | 1/2013 | Mozeika ................ B25J 9/0084 264/40.1 |
| 2013/0241407 | A1 | | 9/2013 | Whyman |
| 2014/0132386 | A1 | | 5/2014 | Kostelnik et al. |
| 2014/0134335 | A1 | | 5/2014 | Pridoehl et al. |
| 2014/0231266 | A1 | | 8/2014 | Sherrer et al. |

OTHER PUBLICATIONS

Kim, et al.; "Fabrication of Terahertz Metamaterials by Laser Printing;" Optical Society of America, Optics Letters, vol. 35, No. 23; Dec. 1, 2010; pp. 4039-4041.

Walther et al.; "Terahertz Metamaterials Fabricated by Inkjet Printing;" American Institute of Physics, Applied Physics Letters 95,Nov. 25, 2007; Dec. 23, 2009; pages; 3 pages.

PCT Notification of Transmittal of the International Search Report and the Written Opinion of the International Searching Authority, or the Declaration; dated Sep. 1, 2015; for PCT Pat. App. No. PCT/US2015/029629; 1 page.

PCT International Search Report dated Sep. 1, 2015; for PCT Pat. App. No. PCT/US2015/029629; 4 pages.

PCT Written Opinion of the International Searching Authority; dated Sep. 1, 2015; for PCT Pat. App. No. PCT/US2015/029629; 6 pages.

Communication pursuant to Article 94(3) EPC dated Dec. 6, 2018 for European Application No. 15726429.2; 8 Pages.

N.I. Avtomonov, V.D. Naumenko, Dmytro M. Vavri, Klaus Schünemann, A.N. Suvorov, V.A. Markov, Toward Terahertz Magnetrons: 210-GHz Spatial-Harmonic Magnetron With Cold Cathode, IEEE vol. 59, No. 12, Dec. 2012, pp. 3608-3611.

John H. Booske, Richard J. Dobbs, Colin D. Joye, Carol L. Kory, George R. Neil, Gun-Sik Park, Jaehun Park, Richard Temkin, Vacuum Electronic High Power Terahertz Sources, IEEE, vol. 1, No. 1, Sep. 2011, pp. 54-75.

Andrey D. Andreev, Kyle J. Hendricks, Multicavity Magnetron With the "Rodded" Quasi-Metamaterial Cathode, IEEE, vol. 41, No. 2, Feb. 2013, pp. 400-407.

A. Palevsky, G. Bekefi, Microwave emission from pulsed, relativistic e-beam diodes. II. The multiresonator magnetron, American Institute of Physics, May 1979, pp. 986-996.

Lens 850-R, Proven Industrial Additive Manufacturing System for Repair, Rework, Modification and Manufacturing, Optomec, 2 pages.

Marco Caiazzo, Stefano Maci, Nader Engheta, A Metamaterial Surface for Compact Cavity Resonators, University of Pennsylvania Scholarly Commons, IEEE, vol. 3, 2004, 6 pages.

3D Metal Printing: Top 10 Questions, Optomec, 2 pages.

Final Report for AOARD Grant FA2386-10-1-4041, Some Studies of slow-wave metamaterials and their tunability, 10 pages, date: Aug. 19, 2011.

Andrey D. Andreev, Maysa-Maria Peterson Lach, J. Gregory Moxness, 3D Printing and adaptive Manufacturing of Advanced Slow-Wave Structures for Millimeter-Wavelength and Terahertz-Frequency High-Power Vacuum Electronic Slow-Wave Devices, 2 pages.

Paul D. Gensheimer, Christopher K. Walker, Richard W. Ziolkowski, Christian Drouet D'Aubigny, Full-Scale Three-Dimensional Electromagnetic Simulations of a Terahertz Folded-Waveguide Traveling-Wave Tube Using ICEPIC, IEEE, vol. 2, No. 2, Mar. 2012, pp. 222-230.

A.I. Nashed, S.K. Chaudhuri, S. Safavi-Naeini, Analysis and Design of a Novel Photonic Crystal-Based Sub-mm/THz Backward-Wave Oscillator, IEEE, vol. 2, No. 6, Nov. 2012, pp. 642-651.

Zhangliang Wang, Yubin Gong, Yanyu Wei, Zhaoyun Duan, Yabin Zhang, Linna Yue, Huarong Gong, Hairong Yin, Zhigang Lu, Jin Xu, Jinjun Feng, High-Power Millimeter-Wave BWO Driven by Sheet Electron Beam, IEEE, vol. 60, No. 1, Jan. 2013, pp. 471-477.

Quin-Lun Liu, Zi-Cheng Wang, Pu-Kun Liu, Chao-Hai-Du, Hai-Qiang Li, An-Yu-Xu, A THz Backward-Wave Oscillator Based on (56) References Cited

OTHER PUBLICATIONS a Double-Grating Rectangular Waveguide, IEEE, vol. 60, No. 4, Apr. 2013, pp. 1463-1468.

* cited by examiner

*FIG. 1A*

PRIOR ART

FIG. 1B

PRIOR ART

RAPID 3D PROTOTYPING AND FABRICATING OF SLOW-WAVE STRUCTURES, INCLUDING ELECTROMAGNETIC META-MATERIAL STRUCTURES, FOR MILLIMETER-WAVELENGTH AND TERAHERTZ-FREQUENCY HIGH-POWER VACUUM ELECTRONIC DEVICES

CROSS REFERENCE TO RELATED APPLICATION

This application claims priority from U.S. Provisional application Ser. No. 62/040,231 filed on Aug. 21, 2014 which is incorporated herein by reference.

TECHNICAL FIELD

This disclosure relates generally to slow-wave structures, including electromagnetic meta-material structures, for generation or amplification of electromagnetic waves, and more particularly to slow-wave structures, including electromagnetic meta-material structures, for generation or amplification of electromagnetic waves by high-power slow-wave vacuum electronic devices operating in millimeter-wavelength (30 GHz-300 GHz) and terahertz-frequency (300 GHz and beyond) bands of electromagnetic spectrum.

BACKGROUND AND SUMMARY

Figure 1A:
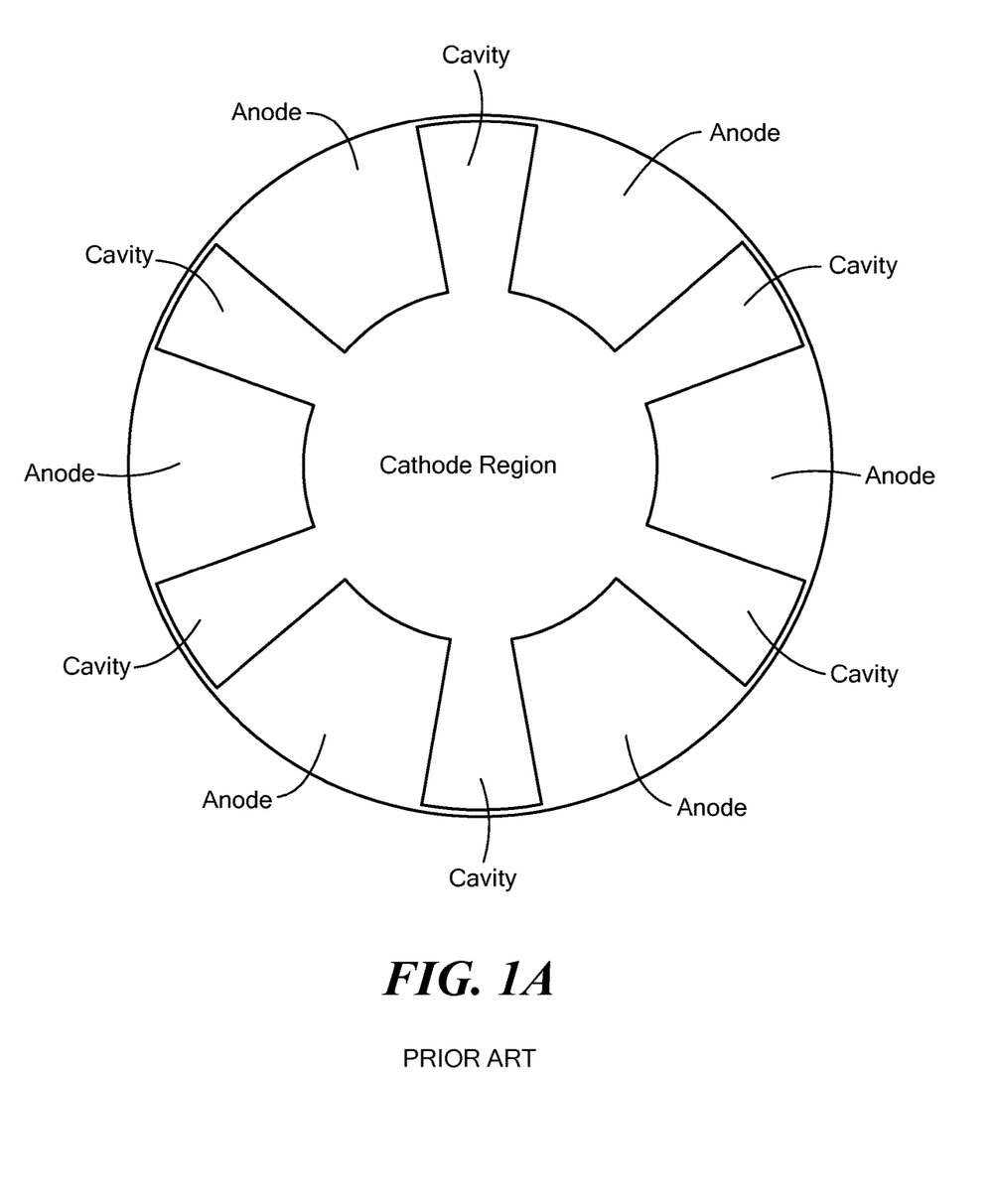
FIGS. 1A and 1B are, respectively, a top view and an isometric view of a slow-wave structure according to the PRIOR ART.
Figure 1B:
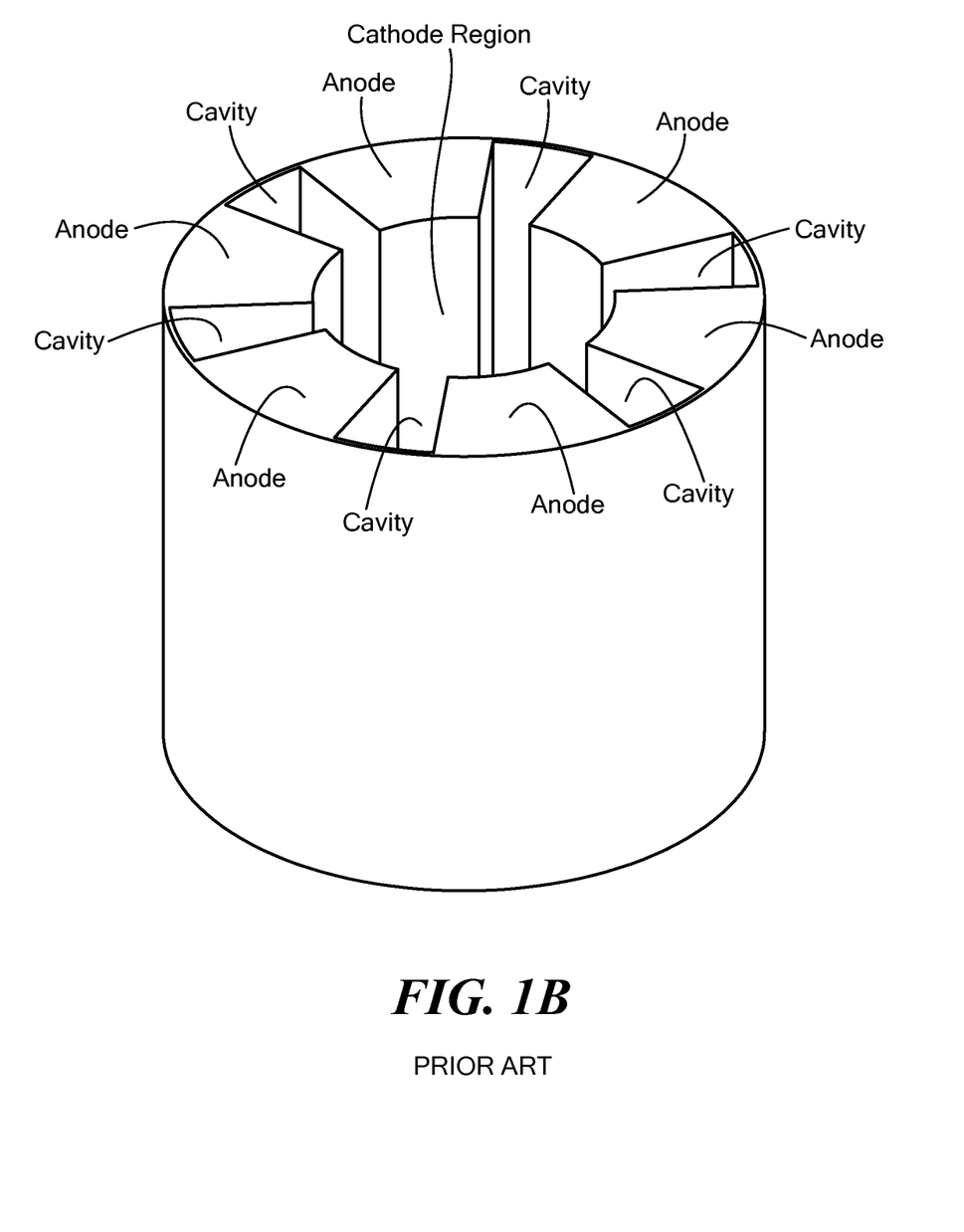
Figure 2A:
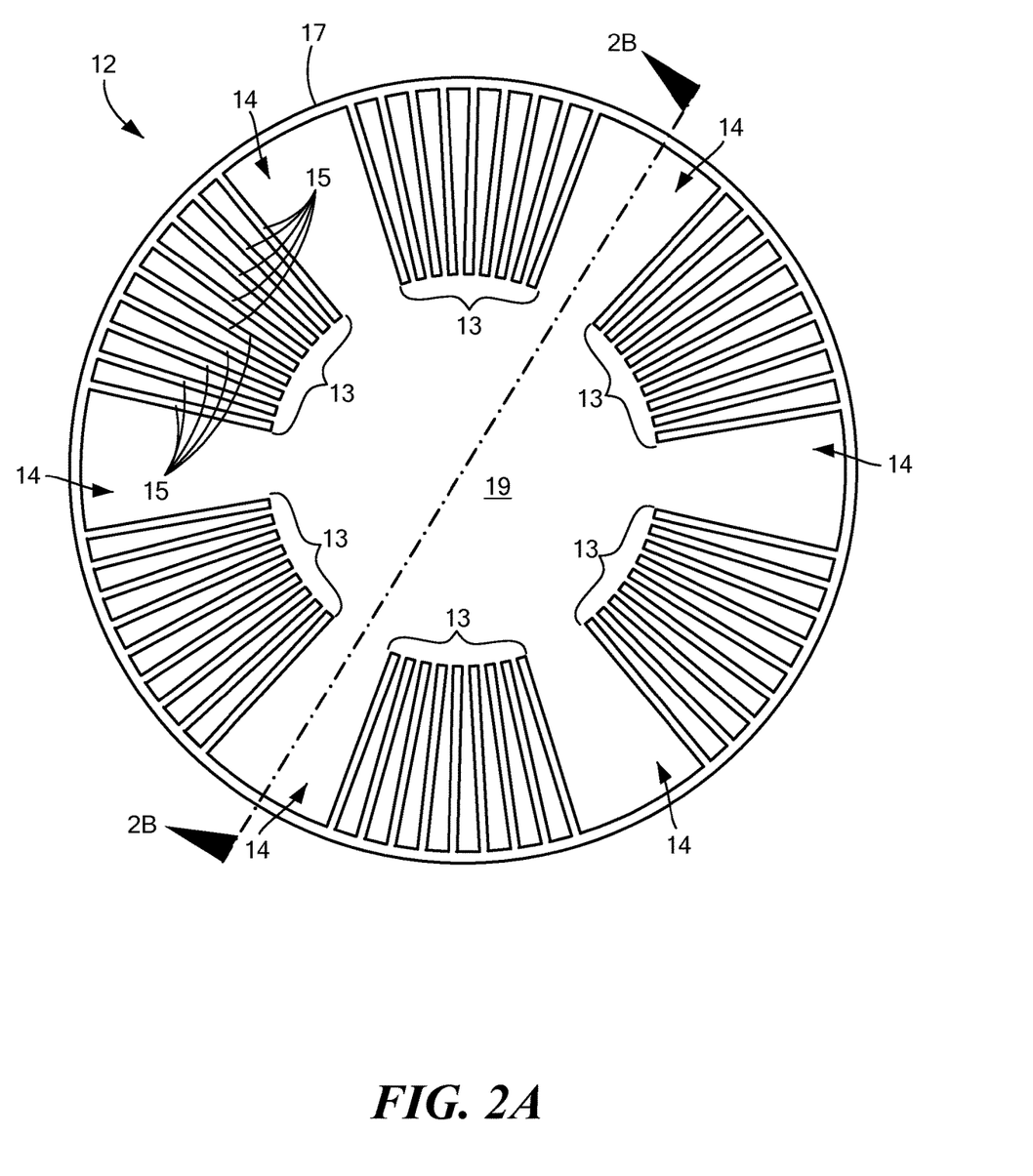
FIGS. 2A and 2B are, respectively, a side view and a cross-sectional, isometric, view showing an inner portion of a slow-wave structure according to the disclosure; this particular anode slow-wave structure comprising radially directed rod-like elements grouped in sections periodically spaced in azimuthal direction and dimensioned for operation at frequencies corresponding to millimeter-wavelength and terahertz-frequency bands of electromagnetic spectrum.
Figure 2B:
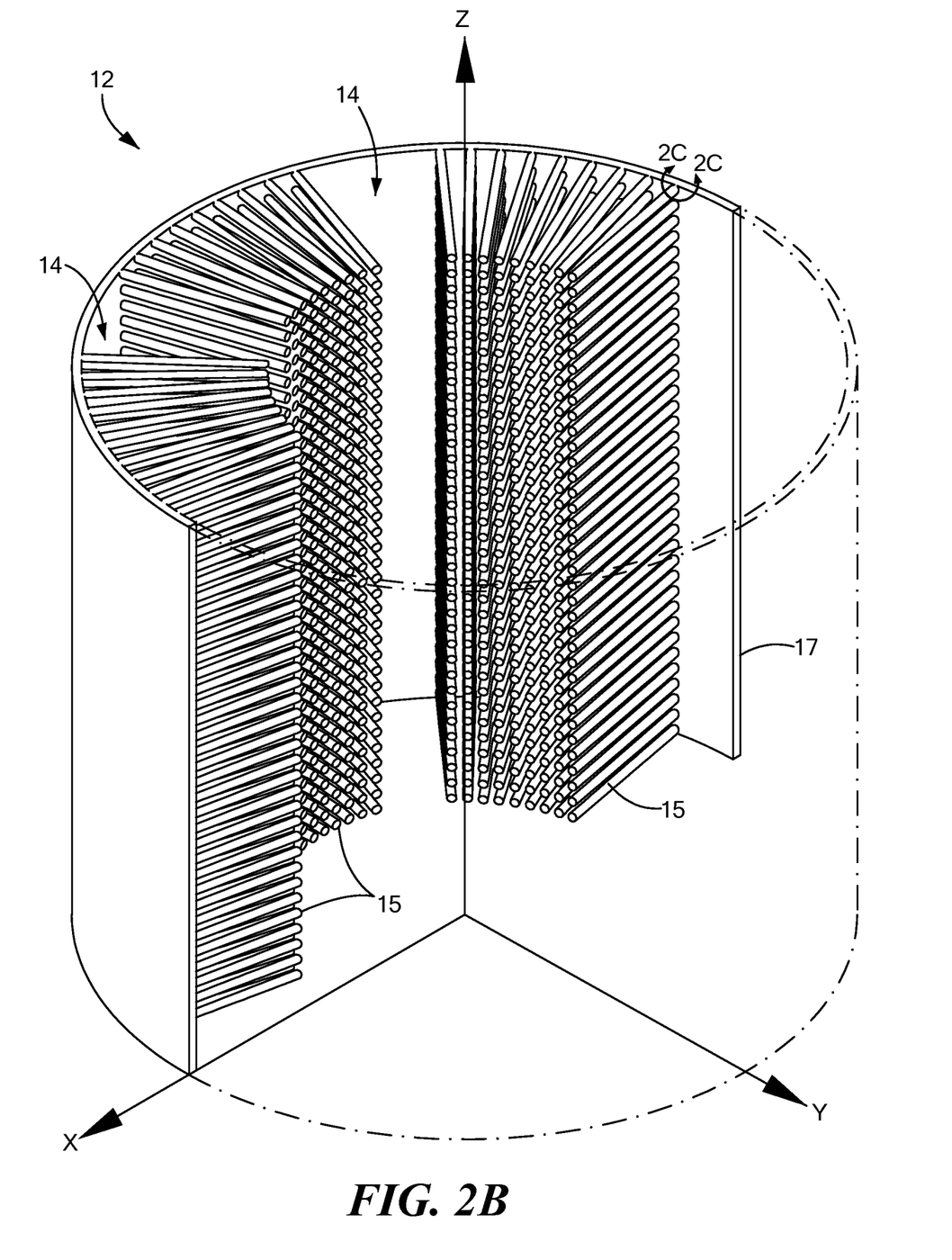
Figure 2C:
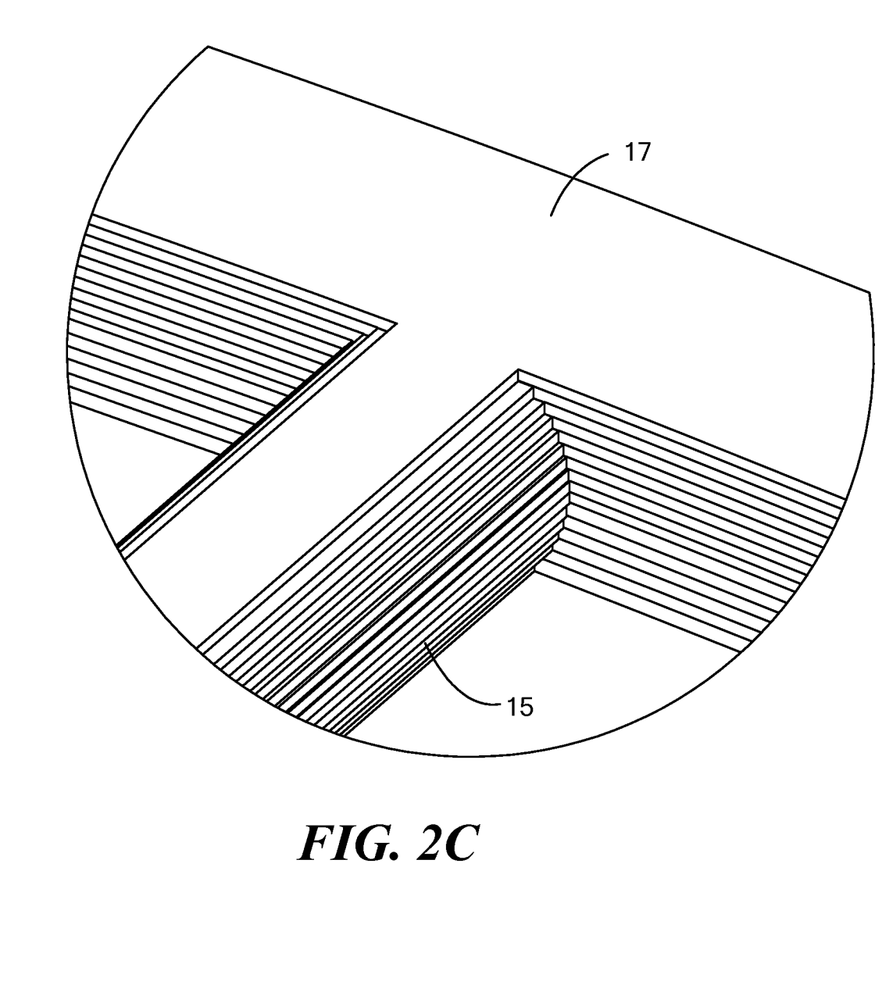
FIG. 2C is an isometric view and FIG. 2D is a cross sectional view looking towards a bark-wall of a portion of the slow-wave structure of FIG. 2B along a plane parallel to the vertical axis passing through a portion of a column of rod-like elements used in such slow-wave structure.
Figure 2D:
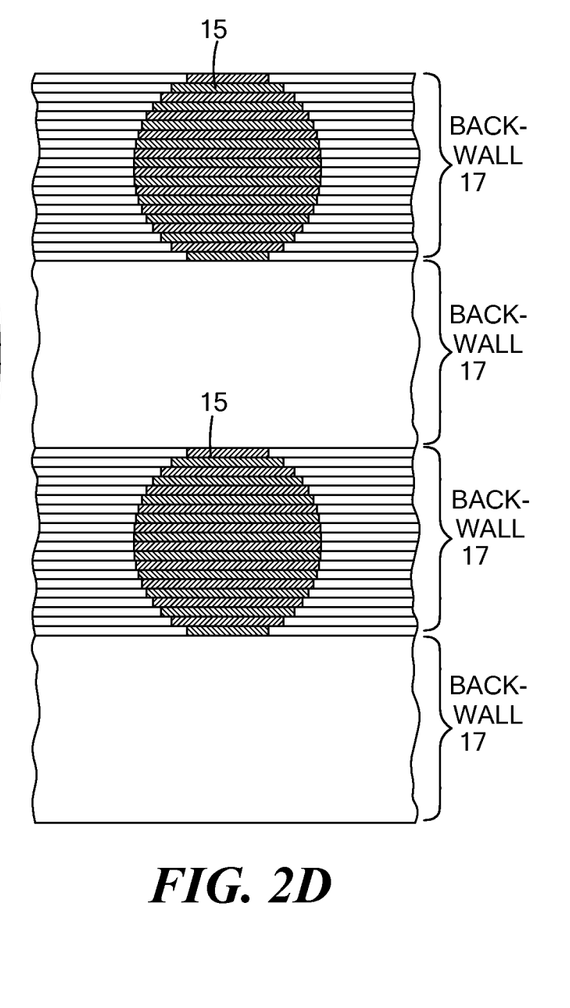

As is known in the art, slow-wave structures having a periodic array of elements of electrically conductive material whose dimensions and/or distances between the elements are comparable or less than a wavelength of an electromagnetic wave growing inside or passing through the slow-wave structure, are used in many high-power slow-wave vacuum electronic devices, such as travelling-wave and backward-wave tubes, and multi-cavity magnetrons. One example of such an slow-wave structure is an anode slow-wave structure shown in FIGS. 1A and 1B having a periodic array of cavities and vanes of electrically conductive material dimensioned for operation at frequencies corresponding to microwave band (0.3 GHz-30 GHz) of electromagnetic spectrum; here, in this example, there are six elements (vanes) of electrically conductive material equally spaced about the circumference of the cylindrical anode every 60 degrees and therefore have a periodicity of sixty degrees.

As is also known in the art, an electromagnetic meta-material structure having periodic array of elements of electrically conductive material whose dimensions and/or distances between the elements are comparable or less than a wavelength of an electromagnetic wave growing inside or passing through the metamaterial structure is one type of a slow-wave structure.

There is a growing need for high-power slow-wave vacuum electronic devices utilizing different slow-wave structures for operation at frequencies corresponding to millimeter-wavelength and terahertz-frequency bands of electromagnetic spectrum. However, fabrication of these slow-wave structures for operation at frequencies corresponding to millimeter-wavelength and terahertz-frequency bands of electromagnetic spectrum requires very precise fabrication methods. This is because the physical dimensions of each single element of these slow-wave structure and/or the distances between the elements are comparable or even less that the wavelength of an electromagnetic wave growing inside or passing through these slow-wave structures, which might be as small as a fraction of a millimeter and even less in millimeter-wavelength and terahertz-frequency bands of electromagnetic spectrum.

Current technologies used to fabricate slow-wave structures for operation at frequencies corresponding to millimeter-wavelength and terahertz-frequency bands of electromagnetic spectrum include, as it is mentioned in an article entitled "Vacuum Electronic High Power Terahertz Sources" by Booske et al., IEEE Transactions on Terahaertz Science and Technology, Vol. 1, No. 1, September 2011, beginning at page 454, are: (i) LIGA (The German acronym LIGA (LIthographie, Galvanik, and Abformung) a process involving photolithography, electroforming and molding and combines the precision of photolithographic methods with the ability to electroform vacuum compatible, low loss materials such as copper to very fine feature sizes around removable, photoresist-based molding agents; (ii) Deep Reactive Ion Etching (DRIE) which is a highly anisotropic etching process for silicon or, more recently, SiC, that produces high vertical aspect ratios up to 50:1; (iii) Electrical Discharge Machining (EDM) methods which rely on a small plasma discharge between the electrode (wire or block) and the work-piece and are usually performed submerged in de-ionized water or dielectric oil with localized flow to flush out debris; (iv) Traditional Computer Numerical Control (CNC) machining; and (v) Laser Ablation which while able to produce very fine features with high precision, is very slow because the debris must be cleared out before more material can be ablated. However, these technologies are relatively costly, complex, and not always environmental friendly.

In accordance with the disclosure, a method is provided for fabrication of slow-wave structures for high-power slow-wave vacuum electronic devices. The method includes: loading a digital three dimensional model of a slow-wave structure in a memory of a 3D printer, the loaded digital three dimensional model having data therein representative of the slow-wave structure to be fabricated by the 3D printer, loading metal powder material into the 3D printer; and operating the 3D printer to fabricate the slow-wave structure according to the digital three dimensional model of the slow-wave structure loaded in a memory of the 3D printer.

In accordance with the disclosure, a method is provided for fabrication of electromagnetic meta-material structures. The method includes: loading a digital three dimensional model of an electromagnetic meta-material structure in a memory of a 3D printer, the loaded digital three dimensional model having data therein representative of the electromagnetic meta-material structure to be fabricated by the 3D printer, loading metal powder material into the 3D printer; and operating the 3D printer to fabricate the electromagnetic meta-material structure according to the digital three dimensional model of the electromagnetic meta-material structure loaded in a memory of the 3D printer.

In accordance with the disclosure, a method is provided comprising using a 3D printing process enabling fabrication of slow-wave structures, including electromagnetic meta-material structures, dimensioned to operate at frequencies corresponding to millimeter-wavelength and terahertz-frequency bands of electromagnetic spectrum.

The use of a 3D printing process enables rapid fabrication of prototypes of slow-wave structures, including electromagnetic meta-material structures, during design/simulation phases of the slow-wave structure, including electromagnetic meta-material structures, design process.

In one embodiment, an electromagnetic meta-material structure is a slow wave structure.

In one embodiment, a method is provided for fabrication of slow-wave structures for high-power slow-wave vacuum electronic devices operating at frequencies corresponding to millimeter-wavelength and terahertz-frequency bands of electromagnetic spectrum. The slow-wave structure has a periodic array of elements of electrically conductive material, each of such elements of electrically conductive material having predetermined dimensions, and such elements of electrically conductive material being spaced one from another a predetermined distance. The method includes: (a) loading a digital three dimensional model of a slow-wave structure in a memory of a 3D printer, the loaded digital three dimensional model having data therein representative of the slow-wave structure to be fabricated by the 3D printer, (b) loading metal powder material into the 3D printer (c) operating the 3D printer to deposit a layer of the metal powder material having a thickness at least ten times less than the lesser of the predetermined dimensions of each one of the elements of electrically conductive material and/or the predetermined distance between these elements of electrically conductive material; (d) melting the deposited layer of the metal powder material in accordance with the loaded three dimensional model of the slow-wave structure to transform the deposited layer of the metal powder material into a layer of melted metal shaped in accordance with the loaded three dimensional model of the slow-wave structure; (e) solidifying the layer of melted metal to transform it into a layer of solid metal shaped in accordance with the loaded three dimensional model of the slow-wave structure; and (f) repeating (c) through (e) to fabricate the slow-wave structure layer by layer in accordance with the loaded three dimensional model of the slow-wave structure.

In one embodiment, an electromagnetic meta-material structure is a slow-wave structure and the method provided for fabrication of slow-wave structures for high-power slow-wave vacuum electronic devices operating at frequencies corresponding to millimeter-wavelength and terahertz-frequency bands of electromagnetic spectrum is also applicable for fabrication of electromagnetic meta-material structures operating at frequencies corresponding to millimeter-wavelength and terahertz-frequency bands of electromagnetic spectrum.

In one embodiment, a slow-wave structure is provided having a periodic array of elements of electrically conductive material spaced one from another in both a plane and along a column disposed along a direction perpendicular to such plane.

In one embodiment, the slow-wave structure is a cylindrical structure wherein the elements of electrically conductive material are radially directed rod-like elements. The dimensions of the elements of electrically conductive material and spacing of the elements of electrically conductive material one from another is determined during design/simulation phases of the slow-wave structure design process.

In one embodiment, the thickness of the elements of electrically conductive material is $\lambda_0/M$, where M is between 3.5 and 4.5, and where $\lambda_0$ is the operating wavelength of an electromagnetic wave growing inside or passing through the slow wave structure.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 2D is a cross sectional view of a portion of the slow-wave structure of FIGS. 2A, 2B and 2C;

Like reference symbols in the various drawings indicate like elements.

DETAILED DESCRIPTION

Referring now to FIGS. 2A, 2B, 2C and 2D, an electromagnetic meta-material structure, here for example, an anode slow-wave structure 12 used for generation or amplification of electromagnetic waves growing inside or passing through the anode slow-wave structure 12 is shown, disposed along the longitudinal, Z, axis and dimensioned to operate at frequencies corresponding to millimeter-wavelength or terahertz-frequency bands of electromagnetic spectrum. It should be understood, however, that the anode slow-wave structure 12 is just one specific example from a great variety of different slow-wave structures, including electromagnetic meta-material structures, which might be dimensioned to operate at frequencies corresponding to millimeter-wavelength or terahertz-frequency bands of electromagnetic spectrum.

More particularly, the anode slow-wave structure 12 has an array of rod-like elements 15 of electrically conductive material. Here, in this specific example, there are six sections 13; each section 13 includes an array of rows and columns of periodically (equally) spaced rod-like elements 15 of electrically conductive material projecting outwardly from an outer circular back-wall 17 of the anode slow-wave structure 12; one of the section 13 being separated from another one of the sections 13 by regions 14. Thus, here the sections 13 are equally spaced about the circumference of the cylindrical structure every 60 degrees and therefore have a periodicity of sixty degrees. It should be understood, however, that these regions 14 may also have an array of the rod-like elements 15. Here, for example, in each one of the sections 13 there are nine, spaced columns of the rod-like elements 15, the columns being periodically (equally) spaced along a portion of the circumference of the back-wall 17 in an X-Y plane, each column of rod-like elements 15 being disposed parallel to the Z axis, shown more clearly in FIG. 2C. Here, the nine rod-like elements 15 in each one of the six sections 13 are equally spaced about the circumference of the cylindrical structure approximately every 4.3 degrees and therefore have a periodicity of 4.3 degrees. Each one of the rod-like elements 15 projects along a radial line extending from the circular back-wall 17 of the anode slow-wave structure 12 for a predetermined radial length less than the radius of the anode slow-wave structure 12 and terminating at the interaction region 19 (the interaction region being the region between a central cathode (not shown) and distal ends of the rod-like elements 15 which is filled with the electron space charge during the operation of a high-power slow-wave vacuum electronic device), as shown. Thus, each one of the rod-like elements 15 has a proximal end terminating at the back-wall 17 and a distal end terminating at the interactive region 19. Here, for example, each one of the rod-like elements 15 has a diameter $\lambda_0/M$, where M is between 3.5 and 4.5, and where $\lambda_0$ is the operating wavelength of the anode slow-wave structure 12 and the rod-like elements 15 are laterally and vertically spaced one from the other a distance $\lambda_0/M$. It should be understood, however, that the number M may be determined during the process of dimensioning the anode slow-wave structure 12 for operating at some particular frequency of interest corresponding to millimeter-wavelength or terahertz-frequency bands of electromagnetic spectrum.

Thus, the anode slow-wave structure 12 includes a periodic array of rod-like elements 15 of electrically conductive material, here, in this example, the distal ends of the rod-like elements 15 equally angularly spaced one from another in the X-Y plane and equally vertically spaced one from another along a column disposed along a direction perpendicular to such plane, that is along a direction parallel to the Z axis, where the X, Y and Z axes are three mutually orthogonal axes. Thus, if the length of the anode slow-wave structure 12 along the Z axis is L, and there are N rod-like elements 15 in a column along a direction parallel to the Z axis, the rod-like elements 15 would have a periodicity of UN along the column. To put it another way, each one row of the a plurality of equally spaced rod-like elements 15 in each one of the sections 13 is disposed azimuthally about the Z-axis in a corresponding one of a spaced plurality of X-Y planes, the plurality of X-Y planes being equally vertically stacked along the Z-axis. Further, the rod-like elements 15 are disposed in the each X-Y along the Z axis project towards an interior region 19 of the anode slow-wave structure 12. Still further, the anode slow-wave structure 12, in this specific example, is a cylindrical structure and the rod-like elements 15 project along radial lines of the cylindrical structure. Further, as noted above, the regions 14 may also have an array of the rod-like elements 15; in which case, if there are R rod-like elements 15, the rod like-elements 15 would be equally spaced around the circumference of the cylindrical anode slow-wave structure 12 with a periodicity R/360°.

Figure 3:
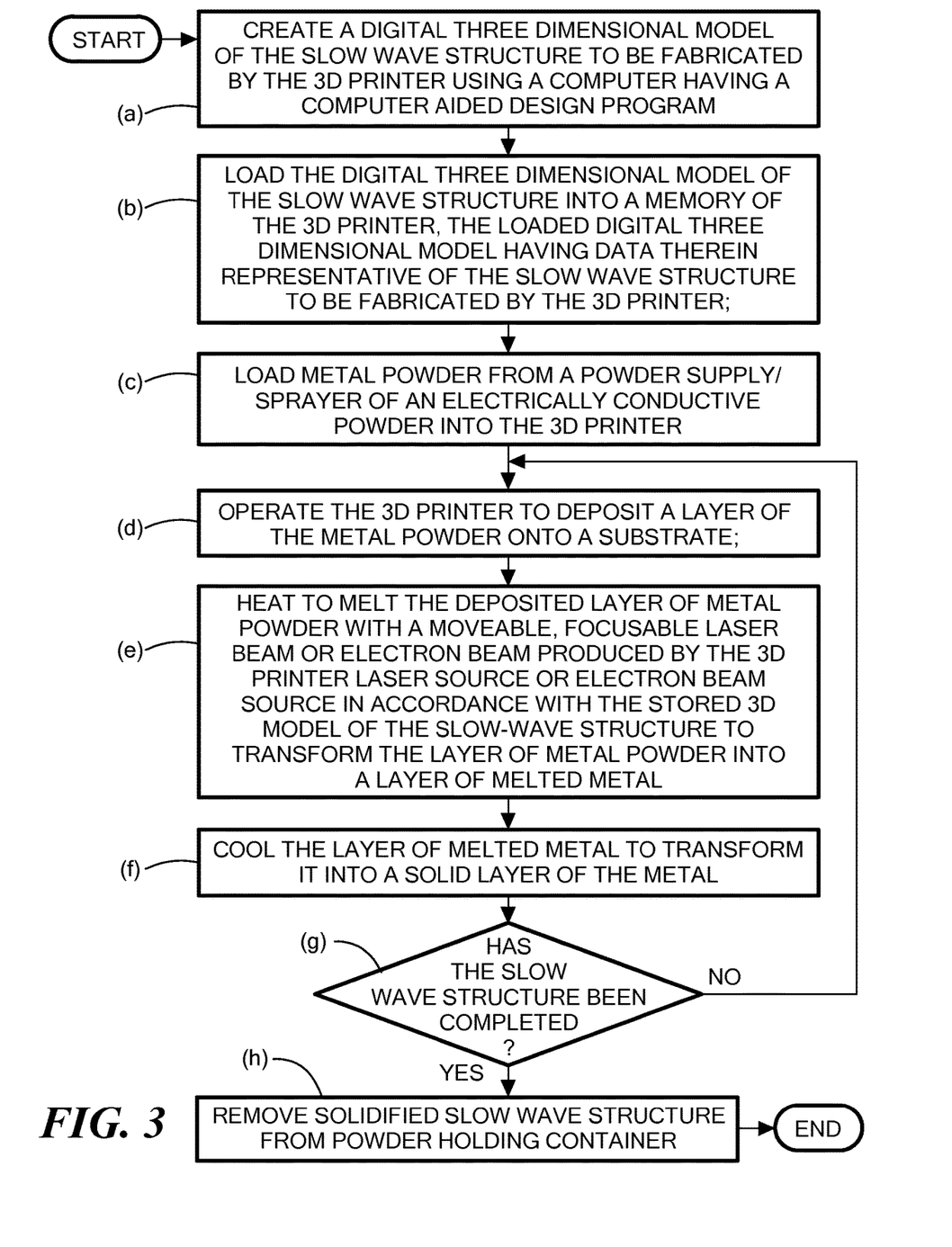
FIG. 3 is a flow chart of a process used to fabricate the anode slow-wave structure of FIGS. 2A-2D according to the disclosure.
Figure 4A:
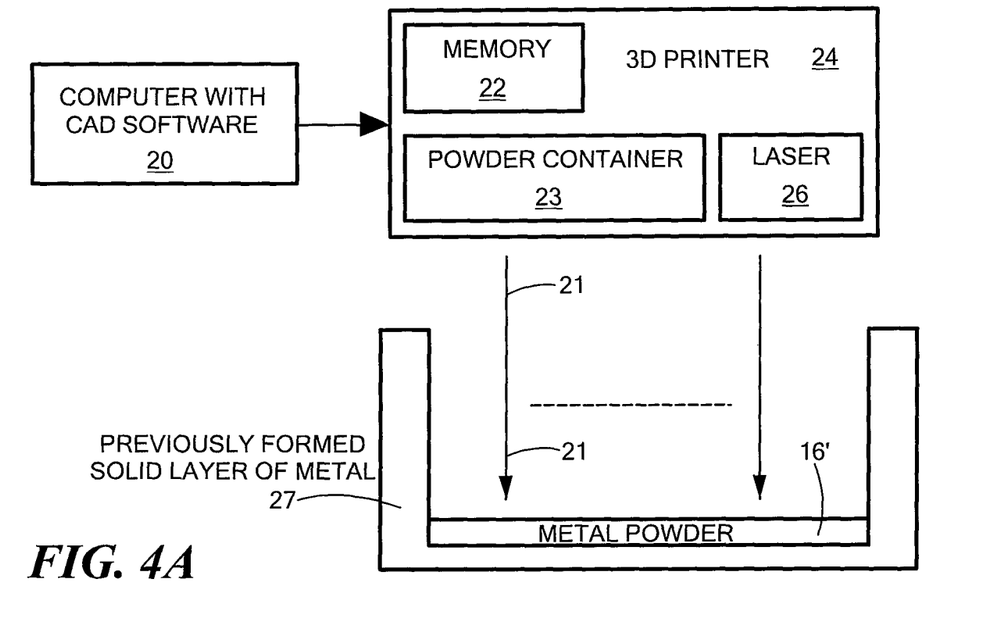
FIGS. 4A and 4B illustrate operation of a 3D printer used to fabricate the anode slow-wave structure of FIGS. 2A and 2B according to the flow chart of FIG. 4.
Figure 4B:
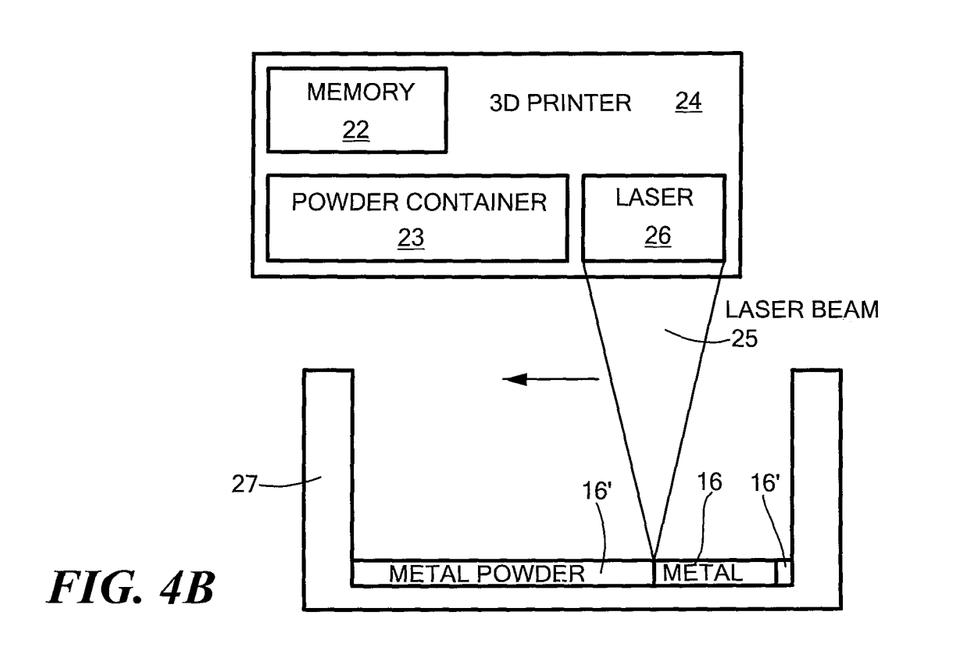

Referring now to FIG. 3, a process for rapid fabrication of the anode slow-wave structure 12 is shown using the 3D printer shown in FIGS. 4A and 4B. Here, the process will be described for rapid 3D fabrication of the anode slow-wave structure 12, it should be understood, however, that the process may be used to rapid fabrication of other slow-wave structures including anode slow wave structures, cathode slow-wave structures, as well as other meta-material structures. The process includes: (a) designing a digital three dimensional model of the slow-wave structure 12 to be fabricated by the 3D printer 24 using a computer 20 having a computer aided design program; (b) loading the digital three dimensional model of the anode slow-wave structure 12 into a memory 22 of the 3D printer 24 (such as manufactured by Optomec Design Company, Albuquerque, N. Mex., www.optomec.com), the loaded digital three dimensional model having data therein representative of the anode slow-wave structure 12 to be fabricated by the 3D printer 24; (c) loading metal powder material 21 from a powder supply/sprayer 23, here the metal powder material is an electrically conductive metal powder material of, for example, stainless steel, into the 3D printer 24; (d) operating the 3D printer 24 to deposit a layer 16 of the metal powder material 21 onto an open can-like, powder holding container 27, as shown in FIG. 4A; (e) melting the deposited layer 16 of the metal powder material 21 with a moveable, focusable laser (or electron) beam 25 (FIG. 4B) produced by the laser (or electron) beam source 26 of the 3D printer 24 in accordance with the loaded three dimensional model of the anode slow-wave structure 12 to transform the layer 16' of metal powder material into the layer 16 of melted metal; (f) solidifying the layer 16' of melted metal after moving the laser (or electron) beam 25 thereby allowing the layer 16 of melted metal to cool and thereby transform the layer 16 of melted metal into a layer 16 of solid metal shaped in accordance with the loaded three dimensional model of anode the slow-wave structure 12; and (g) repeating (c) through (f) to fabricate the anode slow-wave structure 12 layer 16 by layer 16 until completion of the anode slow-wave structure 12 fabrication. It should be noted that each one of the layers 16' of the metal powder material has a thickness at least ten times less than the lesser of predetermined dimensions each one of the rod-like elements 15 and/or the predetermined distance between these rod-like elements 15. The layer 16 of solid metal by layer 16 of solid metal buildup is shown in FIGS. 6A-6G. After fabrication of the anode slow-wave structure 12, the remaining, non-solidified metal powder material 21 is removed from the powder holding container 27 (FIG. 3, (h)).

It is noted in FIG. 4B that the laser (or electron) beam 25 is focused to a focal point at the level of the metal powder material 16' in one layer, then at that focal point, moves in a specific pattern determined by the loaded three dimensional model of the anode slow-wave structure 12, such as, for example, a circular pattern, starting at a predetermined distance from the inner vertical sidewall of the powder holding container 27 with the greatest diameter and then sequencing inwardly with successively smaller diameter and stopping at the distal end of the anode slow-wave structure 12 having completed the transformation of the metal powder material 16' into the layer of solid metal 16; a new layer 16' of metal powder material is deposited; and then the laser (or electron) beam returns to the outer diameter and is focused at a higher focal point along the Z axis on the new layer 16' of the metal powder material to repeat the process.

Figure 5A:
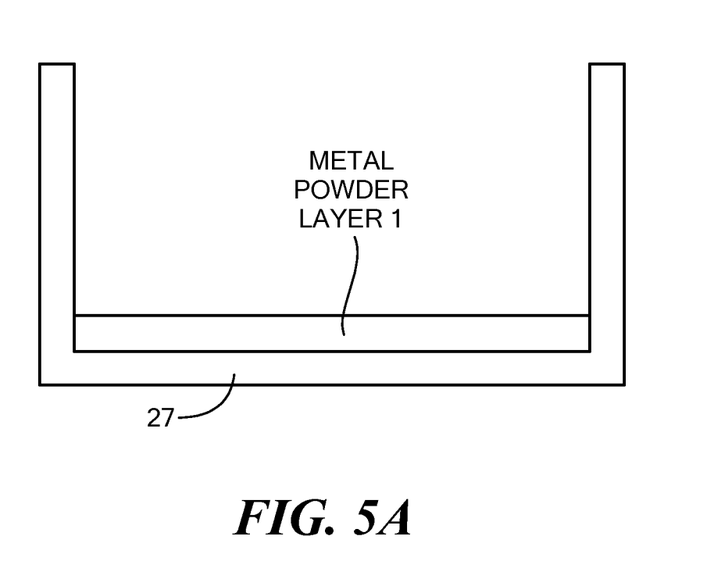
FIGS. 5A-5F illustrate the layer by layer formation during operation of the 3D printer of FIGS. 4A and 4B to fabricate the anode slow-wave structure of FIGS. 2A-2C according to the flow chart of FIG. 4.
Figure 5B:
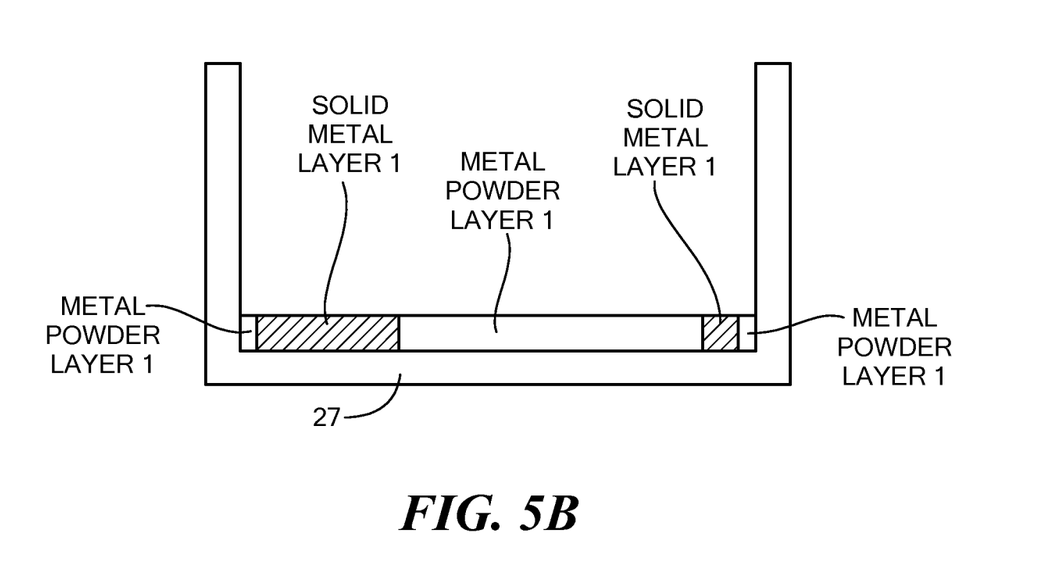

Thus, referring to FIG. 5A, a first layer (layer #1) of the metal powder material is deposited onto the bottom surface of the open can-like, powder holding container 27. Next, referring to FIG. 5B, the laser (or electron) beam melts the portions of the deposited metal power material in layer #1 to form a first layer of the back-wall 17 and the rod-like element 15, extending outwardly therefrom towards, and terminating at the interaction region 19, in one of the rows thereof for each of the six anode sections 13. After the portions of the layer 16 of metal powder material are melted they are solidified after moving the laser (or electron) beam thereby allowing the melted metal to cool, a first layer of the back-wall 17 and the row of rod-like elements 15 are formed, as shown in FIG. 5B. It is noted that metal powder material 16' remains between the outer portion of the rod-like element 15 and the inner sidewall of the powder holding container 27.

Figure 5C:
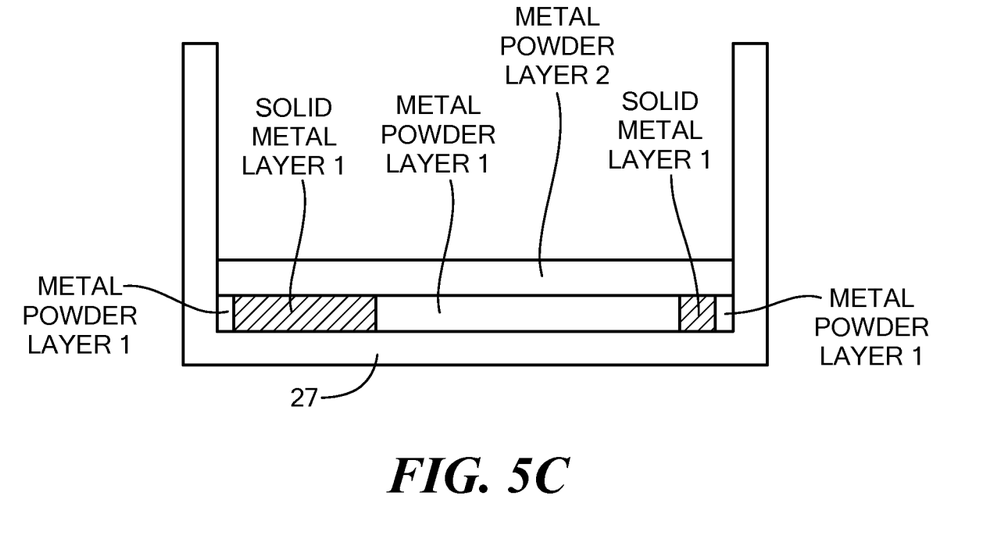
Figure 5D:
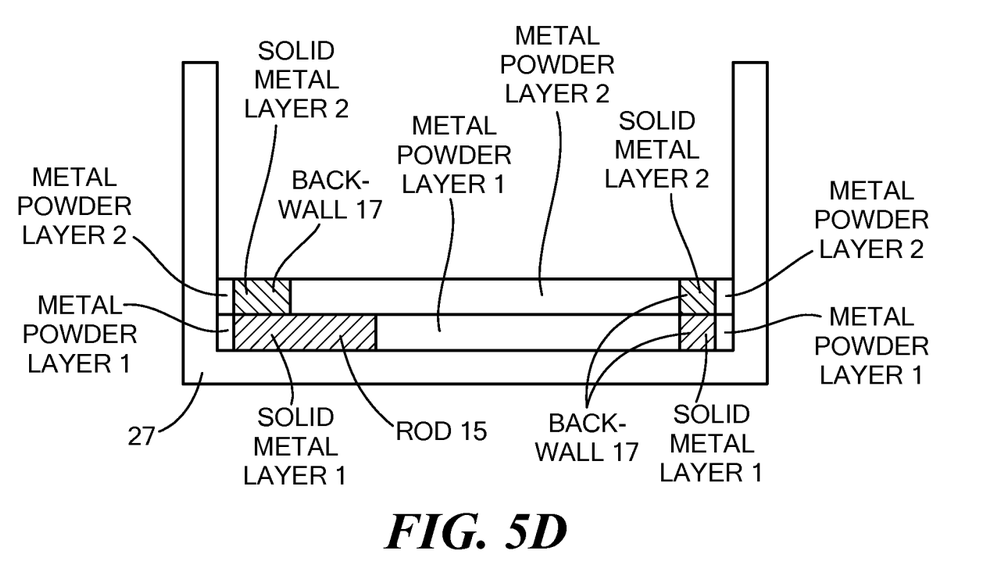

Next, a second layer of metal power material (layer #2) is deposited, as shown in FIG. 5C. Next, referring to FIG. 5D, the laser (or electron) beam melts portions of the deposited layer #2 of metal powder material to form a second layer of the back-wall 17. After the melted portions of layer 2 of metal powder material are solidified, the second layer of the back-wall 17 is formed as shown in FIG. 5D. It is noted that metal powder material 16' remains between the outer portion of the back-wall 17 and the inner sidewall of the powder holding container 27.

Figure 5E:
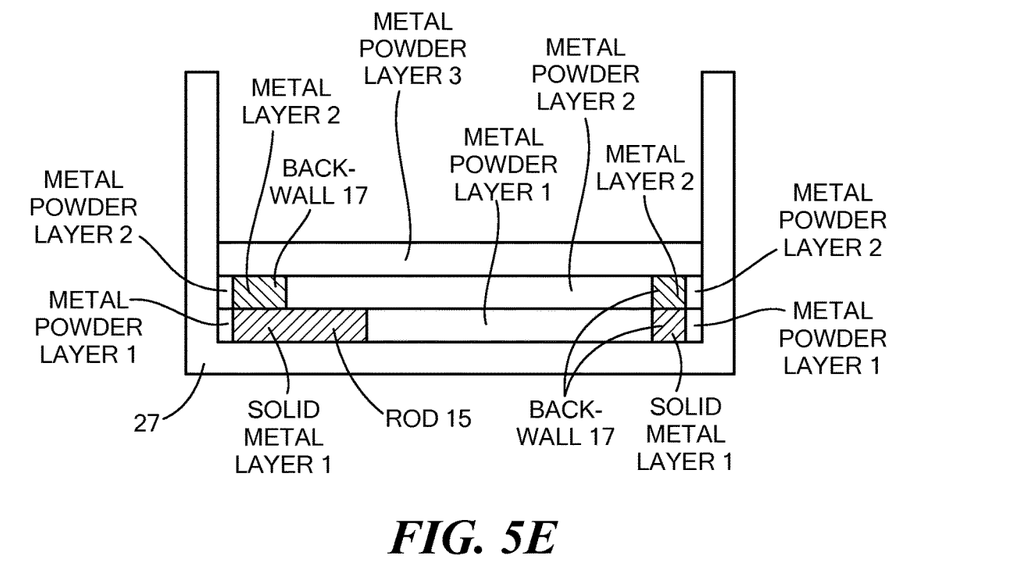
Figure 5F:
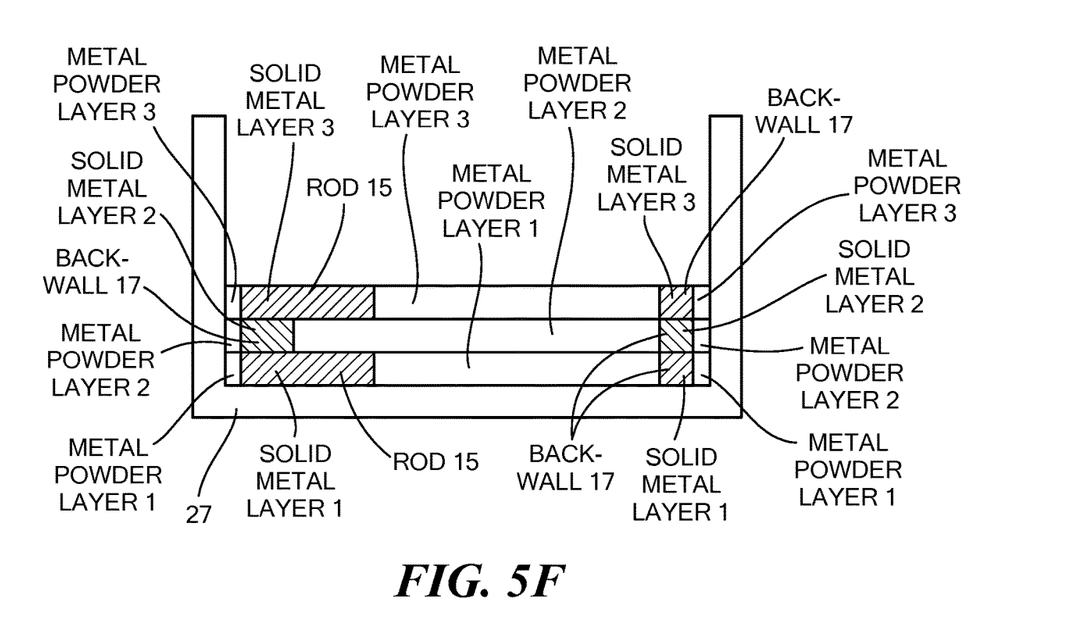

Next, a third layer of metal powder material (layer #3) is deposited, as shown in FIG. 5E. Next, referring to FIG. 5E, the laser (or electron) beam melts portions of the deposited layer #3 of metal powder material to form a third layer of the back-wall 17 and the rod-like element 15, extending outwardly therefrom towards, and terminating at, the interactive region 19, in second of the rows thereof for each of the six anode sections 13. After the melted portions of the layer #3 of metal powder material is solidified, a first layer of the back-wall 17 and the second row of rods 15 are formed, as shown in FIG. 5F. It is again noted that metal powder material 16' remains between the outer portion of the rod-like element 15 and the inner sidewall of the powder holding container 27.

The process described above is repeated until the anode slow-wave structure is fabricated. It is noted that metal powder material 16' remains between the outer back-wall 17 and the inner sidewall of the powder holding container 27 thereby enabling the fabricated anode slow-wave structure described in FIGS. 2A-2C to be vertically oriented inside the powder holding container 27.

Figure 6:
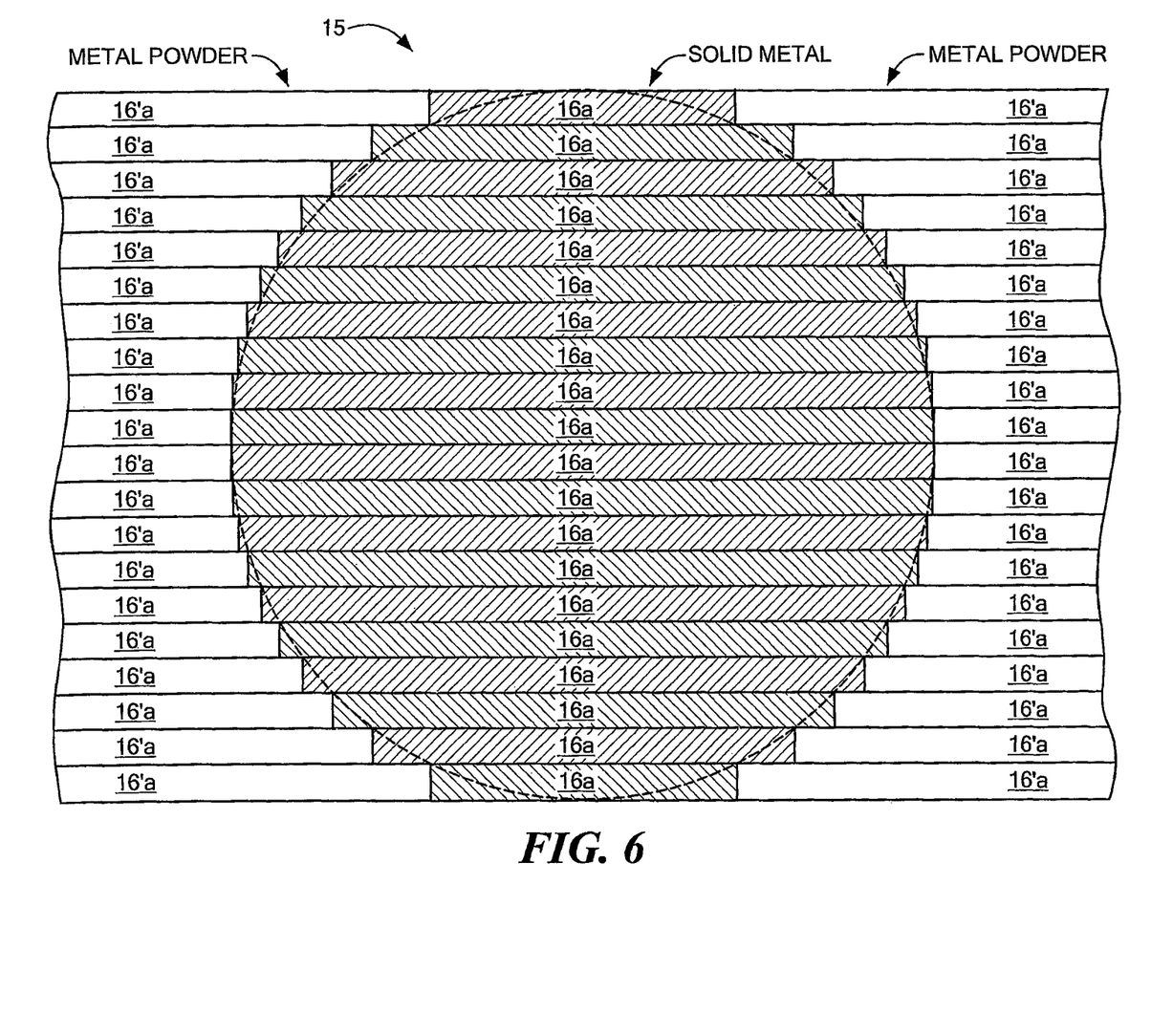
FIG. 6 is a cross-section view of an exemplary one rod-like element of electrically conductive material used in the anode slow wave structure of FIGS. 2A-2D after depositing, melting and solidifying of portions of layers of the metal powder material used in the process to form the rod-like element.

It should be understood, however, that the process described above in connection with FIGS. 5A-5F would produce rod-like elements 15 having rectangular cross sections. If the rod-like elements 15 having either circular or any other cross-sections are desired, the circular or any other cross sections are approximated by a series of rectangular sub-layers 16a, as shown in FIG. 6. Thus, in order to fabricate one such rod-like element 15 a sequence of rectangular metal sub-layers 16a must be used by converting metal powder material sub-layers 16'a into the solid metal sub-layers 16a using the laser (or electron) beam. More particularly, consider that the single rod-like element 15 has a circular cross-section with a diameter $\lambda_0/M$. The rod-like element 15 are made up of a plurality of thin layers, here for example, ten thin layers, each one having a thickness $0.1\lambda_0/M$. The lower sub-layer 16a is formed having a thickness $0.1\lambda_0/M$ and a suitable width to approximate the outer circular perimeter (shown dotted in FIG. 6) of the circular cross section of the rod-like element 15. Next, the second sub-layer 16a is formed on the lower sub-layer 16a having a thickness $0.2\lambda_0/M$. The process repeats increasing the thickness and a suitable width to approximate the outer circular perimeter (shown dotted in FIG. 6) of the circular cross section of the rod-like element 15 of the sub-layers 16a step by step until the sub-layer 16a having a thickness $0.5\lambda_0/M$ and a width $0.5\lambda_0/M$ is formed. Next, the process repeats decreasing the thickness and width of the sub-layers step by step until the upper sub-layer 16a having a thickness $0.1\lambda_0/M$ and a suitable width to approximate the outer circular perimeter (shown dotted in FIG. 6) of the circular cross-section of the rod-like element 15. This completes the fabrication of one rod-like element 15.

It is also noted that the portions of the back-wall 17 from which the rod-like element 15 extend and which are integrally formed is also formed using the stepped process described above. The portions of the back-wall 17 between the rod-like elements 15 may be formed with ten layers each having a thickness of $0.1\lambda_0/M$ or one layer having the thickness of $\lambda_0/M$ in one step.

As noted above, the use of 3D printing process enables rapid fabrication of anode slow-wave structures and test a variety of parameters such as the dimensions of the rod-like elements 15, the azimuthal and vertical periodicity of the rod-like elements 15, the number of the rod-like elements 15, and the value of M for operating at particular frequency of interest corresponding to millimeter-wavelength or tera-hertz-frequency bands of electromagnetic spectrum during design/simulation phases of the anode slow-wave structures design process. Thus, a method is disclosed for rapid fabrication of anode slow-wave structures, including electro-magnetic metamaterial structures comprising: using a computer having a computer aided design program to design the digital three dimensional model of the slow-wave structure; loading the digital three dimensional model of the anode slow-wave structure in a memory of a 3D printer; operating the 3D printer with the loaded digital three dimensional model of the anode slow wave structure to fabricate the anode slow wave structure in accordance with the loaded digital three dimensional model of the anode slow wave structure; and testing the fabricated anode slow wave structure.

A number of embodiments of the disclosure have been described. Nevertheless, it will be understood that various modifications may be made without departing from the spirit and scope of the disclosure. For example, while the anode slow-wave structure has been shown having a circular configuration, the anode slow-wave structure may be fabricated by a 3D printer having other configurations as, for example, linear three dimensional slow-wave structures for operation in travelling wave or backward-wave tubes. Furthermore, not only anode slow-wave, including electromagnetic meta-material structure may be fabricated using 3D printing process, but, for example, cathode slow-wave structures such as, for example, cathode meta-material slow-wave structures, or, for example, different electromagnetic meta-material structures. Accordingly, other embodiments are within the scope of the following claims.

What is claimed is:

1. A method, comprising: 3D printing a slow-wave structure, the slow wave structure comprising: a unitary structure comprising: an outer wall extending longitudinally along a z-axis, the z-axis being perpendicular to an x-y plane, the outer wall enclosing a central region; and a plurality of sections, the sections being angularly spaced one from another around the central region, each one of the sections comprising: a periodic array of elements of electrically conductive material projecting radially inwardly from the outer wall in the x-y plane and terminating in the central region, the elements in each one of the sections being angularly spaced one from another in both the x-y plane and along columns disposed along parallel to the z-axis;

wherein each one of the sections comprises: a plurality of rows of the elements, the elements in each one of the rows being angularly spaced one from another, and a plurality of columns of the elements, the elements in each one of the columns being angularly spaced one from another; and wherein the angularly spacing between the sections is greater than the angularly spacing between the elements in each one of the columns and each one of the rows.

2. A method comprising: 3D printing a slow-wave structure, the slow-wave structure comprising: a unitary structure comprising: an outer wall extending longitudinally along a z-axis, the z-axis being perpendicular to an x-y plane, the outer wall enclosing a central region; and a plurality of sections, the sections being angularly spaced one from another around the central region, each one of the sections comprising: a periodic array of rows and columns of angularly spaced rod-like elements disposed in a corresponding one of a angularly spaced plurality of parallel X-Y planes, the plurality of X-Y planes being vertically stacked along a Z-axis; distal ends of the elements being equally angularly spaced one from another in each of the rows thereof and the X-Y planes being equally angularly spaced one from another along a Z-axis, the Z axis being perpendicular to the X-Y planes, the rod-like elements projecting radially inwardly from the outer wall and terminating in the central region;

wherein each one of the sections comprises: a plurality of rows of the rod-like elements, the rod-like elements in each one of the rows being angularly spaced one from another; and a plurality of columns of the rod-like elements, the rod-like elements in each one of the columns being angularly spaced one from another; and wherein the spacing between the sections is greater than the spacing between the rod-like elements in each one of the columns and each one of the rows.

3. A method comprising 3D printing a slow-wave structure comprising a periodic array of elements of electrically conductive material spaced one from another in both a plane and along a column disposed along a direction perpendicular to such plane; wherein the elements of electrically conductive material are disposed in the plane project towards an interior region of the slow-wave structure; wherein the slow-wave structure is a cylindrical structure and wherein the elements of electrically conductive material project along radial lines of the cylindrical structure and comprising a periodic array of rows and columns of each one row of a plurality of spaced rod-like elements disposed in a corresponding one of a spaced plurality of parallel X-Y planes, the plurality of X-Y planes being vertically stacked along a Z-axis; distal ends of the elements being equally spaced one from another in each of the rows thereof and the X-Y planes being equally spaced one from another along a Z-axis, the Z-axis being perpendicular to the X-Y planes, wherein the thickness of the elements is $\lambda 0/M$ where M is between 3.5 and 4.5 where $\lambda 0$ is the operating wavelength of the slow-wave structure, and wherein the slow-wave structure operates at frequencies corresponding to millimeter-wavelength and terahertz-frequency bands of the electromagnetic spectrum.

* * * * *